United States Patent [19]

Matossian et al.

[11] Patent Number: 5,455,061
[45] Date of Patent: Oct. 3, 1995

[54] NONDESTRUCTIVE DETERMINATION OF PLASMA PROCESSING TREATMENT CHARACTERISTICS

[75] Inventors: Jesse N. Matossian, Canoga Park; John J. Vajo, Calabasas, both of Calif.

[73] Assignee: Hughes Aircraft Company, Los Angeles, Calif.

[21] Appl. No.: 372,793

[22] Filed: Dec. 23, 1994

Related U.S. Application Data

[63] Continuation of Ser. No. 113,556, Aug. 27, 1993, abandoned.
[51] Int. Cl.⁶ .............................. B05D 3/06; C23C 14/00; C23C 1/00
[52] U.S. Cl. ................ 427/8; 427/10; 427/525; 427/523; 427/528; 427/569; 204/192.33; 216/67
[58] Field of Search .................... 427/8, 10, 523, 427/525, 526, 528, 488, 489, 490, 491, 535, 536, 537, 539, 569, 570, 575; 156/643; 204/192.32, 192.33, 192.36

[56] References Cited

U.S. PATENT DOCUMENTS

| | | | |
|---|---|---|---|
| 3,583,361 | 6/1971 | Laudel | 427/523 |
| 4,613,403 | 9/1986 | Kugan | 427/523 |
| 4,764,394 | 8/1988 | Conrad . | |
| 4,806,386 | 2/1989 | Ohta et al. | 427/523 |
| 4,806,849 | 2/1989 | Kihira et al. | 427/10 |
| 4,960,072 | 10/1990 | Ishihara | 427/489 |
| 5,133,849 | 7/1992 | Kinoshita et al. | 427/523 |
| 5,185,067 | 2/1993 | Shibahara | 427/523 |
| 5,215,789 | 9/1993 | Oyachi et al. | 427/536 |
| 5,374,456 | 12/1994 | Matossian et al. | 427/570 |

FOREIGN PATENT DOCUMENTS

| | | |
|---|---|---|
| 0259961 | 3/1988 | European Pat. Off. . |
| 0499197 | 8/1992 | European Pat. Off. . |

OTHER PUBLICATIONS

Hurley et al, "Ion Plating of Metal Films in Plastic Substrates", *Thin Solid Films*, 92 (Jun. 1982) pp. 99–106.

Suzuki et al "Surface Modification of a Plastic Substrate During Ion Plating", *Thin Solid Films*, 80 (Jun. 1981) pp. 67–76.

R. G. Wilson et al, "Secondary Ion Mass Spectrometry, A Practical Handbook for Depth Profiling and Bulk Impurity Analysis", John Wiley & Sons, 1989, p. 4.3.1, Section 4.3 (no month available).

*Primary Examiner*—Marianne Padgett
*Attorney, Agent, or Firm*—V. D. Duraiswamy; Wanda Denson-Low

[57] ABSTRACT

Plasma processing treatment characteristics of an object are determined nondestructively, prior to plasma processing the object, by placing an indicator layer over at least a portion of the plasma processing surface of the object, so as to generally conform to the shape of the surface. An electrically conductive grid is placed over the indicator layer, and made electrically common with the object. The indicator layer is implanted through the conductive grid, and changes properties responsive to the plasma processing treatment. The implanted indicator layer is thereafter analyzed to determine the treatment characteristics of the indicator layer. Plasma processing spatial distribution and total dosage are determined nondestructively from this information and used to establish the plasma processing program for the object and adjust the plasma processing apparatus as needed.

21 Claims, 4 Drawing Sheets

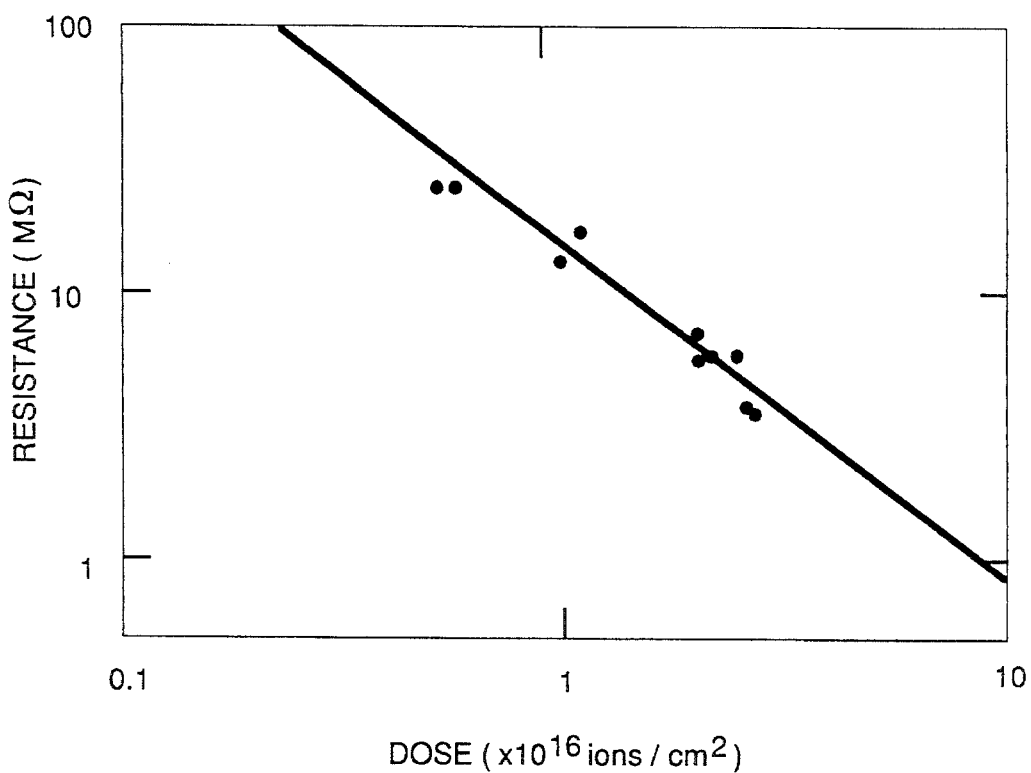
FIG. 5.
FIG. 6.
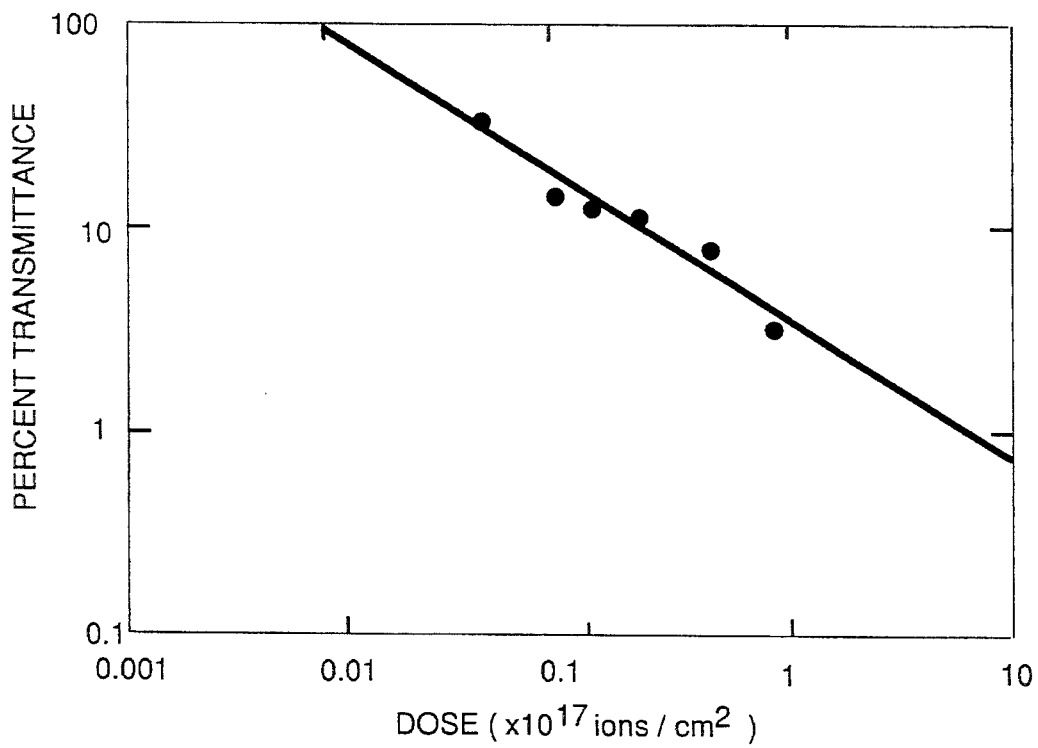

NONDESTRUCTIVE DETERMINATION OF PLASMA PROCESSING TREATMENT CHARACTERISTICS

This is a continuation application Ser. No. 08/113,556, filed Aug. 27, 1993, now abandoned.

BACKGROUND OF THE INVENTION

This invention relates to the plasma processing of an object, and, more particularly, to nondestructively assessing the plasma processing operating conditions required to achieve preselected treatment characteristics of such an object before plasma processing the object itself.

Plasma processing encompasses a family of techniques that may be used to alter the surface properties of objects in a beneficial manner. To cite an example, certain types of tooling, such as some stamping and pressing dies, are desirably made of a soft material that is readily machined or formed. This allows the tooling to be manufactured relatively inexpensively. Nonmetallic materials made of epoxy and modified epoxy are candidates for use as such tooling. On the other hand, the working surface of the tooling should be as wear resistant as possible so that the dimensions do not change as successive parts are manufactured.

The sur face softness of the nonmetallic tooling that permits easy machining results in a short useful life of the tool. For production applications, an epoxy tool cannot be used without a treatment to make the surface more wear resistant. It has been found that several types of ion and electron treatments of the surfaces of polymers such as epoxies and the surfaces of metals can significantly increase their useful lives. Such treatments include, for example, ion implantation, ion deposition and ion mixing, and electron bombardment.

Ion implantation is a process wherein ions are accelerated by an electrostatic potential to impact a surface. The energy of the ions causes them to be imbedded beneath the surface. A sufficiently high dose or concentration of implanted ions can significantly increase the hardness of the surface layer. In ion mixing, a thin (about 300–600 Angstrom) material layer is first deposited onto a surface to be treated, and then the composite surface is ion implanted to mix the deposited material atoms into the surface. Ion deposition is similar to ion mixing except that the accelerating energies of the ions are lower, with the result that the ions are deposited simultaneously with the deposited material layer upon the surface being treated rather than imbedded beneath its surface. In electron bombardment of polymeric surfaces, energetic electrons (100–20,000 volts or more) are accelerated by an electrostatic potential to cause them to impact into the surface to be treated. The use of these treatments produce improved hardness and wear characteristics of the substrate.

Such treatments are traditionally accomplished by accelerating a beam of electrical charge carriers (ions or electrons) using electrostatic acceleration electrodes. This approach, while effective, has the drawback that it is difficult to uniformly treat a large, three-dimensional, irregularly shaped object such as a typical automotive tool that may measure 3 feet by 5 feet by 1 foot in size. The beam of charge carriers must be moved slowly over the entire surface, including those areas that may be rather inaccessible such as deep holes or recesses, or for protrusions that stick out from the surface. In these cases, the object must be manipulated to uniformly treat the area with a beam. For large tools or for large numbers of smaller objects having such surface features, surface treatment using ion or electron beams becomes prohibitively slow and expensive.

An alternative approach that has promise for ion implanting, ion depositing, or ion mixing of the surfaces of large objects is plasma ion implantation (PII), described in U.S. Pat. No. 4,764,394. A plasma of ions is created adjacent to the surface of the object to be implanted, and the object is electrostatically charged to a potential opposite to that of the ions. For example, if positively charged nitrogen ions are to be implanted, the object is negatively charged using repetitive voltage pulses of typically about 100,000 volts or more. The nitrogen ions are attracted to the surface of the object by this accelerating potential and driven into the surface and sub-surface regions of the substrate. Plasma ion implantation has the advantage that the plasma of ions provides a source that is distributed around the entire surface area of the object, and uniform implantation over the entire surface area is simultaneously achieved.

Plasma ion mixing may be performed in a similar manner, except that first a thin layer of material is deposited onto the surface prior to implantation. Plasma ion deposition is also performed in a similar manner, except that the accelerating potential is typically lower so that the ions and material layer deposit upon the surface instead of being driven into the sub-surface layers. It is possible to achieve electron bombardment of a surface using plasma techniques similar to those used in ion implantation. Plasma ion implantation, plasma ion deposition and plasma ion mixing, and electron bombardment, and related techniques, are collectively termed "plasma processing".

When plasma processing of an irregularly shaped object is to be performed, care must be taken to achieve the desired treatment of the object at all locations on the surface of the object. The irregular shape of the object makes it difficult, if not impossible, to design the plasma processing apparatus and system from first principles, so that exactly the desired treatment at each location is achieved.

At the present time, a trial-and-error approach is used to determine the treatment characteristics of such objects. A "dummy" object is prepared with the shape and size of the object to be plasma processed. A number of metallic test coupons are affixed to various locations on the surface of the dummy object. The dummy object is plasma processed by the intended approach, and the coupons are analyzed to determine the treatments at each coupon location. The total treatment and spatial distribution are then mapped. If the total treatment and spatial distributions are not as desired, the plasma processing system is altered as necessary, and the checking process repeated. Once the final processing parameters have been identified, the dummy object is replaced by the object to be plasma processed and the processing is performed.

This technique for assessing treatment characteristics has major drawbacks. It is slow and tedious. The coupons must be individually analyzed using sophisticated analysis techniques such as SIMS (Secondary Ion Mass Spectroscopy), which may not be readily available in some instances. For a typical case of a commercial-scale automotive die to be plasma ion implanted, 20–50 coupons are required and the analysis can easily require a day to complete. A duplicate dummy object must be manufactured to at least approximately the dimensions of the object to be implanted, which can be a considerable expense because the object to be implanted may otherwise be a one-of-a-kind piece. As a variation of this approach, the ion dosage characteristics can be assessed on the object itself, but this is impractical for large-scale objects that cannot fit inside a SIMS apparatus. Furthermore, if the optimum dosage is accidentally exceeded, it could ruin the object for its intended purpose.

There is a need for an improved approach to determining the operating parameters required to achieve the desired treatment characteristics of large-scale, irregularly shaped objects, or large numbers of smaller objects, in plasma processing operations. The present invention fulfills this need, and further provides related advantages.

SUMMARY OF THE INVENTION

The present invention provides a nondestructive method for determining treatment characteristics of an object to be plasma processed. The method is quick and inexpensive to perform. The results are both qualitative in that spatial distributions can be quickly assessed, and quantitative in that the total plasma processing treatment can be determined through calibration. The method is preferably performed using the actual object to be plasma processed, but without modifying the object, so that no dummy object is required. This method is particularly valuable for achieving a desired processing total treatment distribution of large, irregularly shaped objects.

In accordance with the invention, a method for determining treatment characteristics of an object processed in a plasma processing system is operable with a three-dimensional, irregularly shaped object having a plasma processing surface that is to be treated by plasma processing. The method includes providing over at least a portion of the plasma processing surface, so as to generally conform to the shape of the plasma processing surface, an indicator layer of an electrically nonconducting or weakly conducting material (herein collectively termed "nonconducting") that changes properties responsively to the plasma processing treatment. Desirably, the indicator layer is removable at a later stage of the processing. The method further includes placing over the indicator layer an electrically conductive grid and plasma processing the indicator layer through the conductive grid, using a plasma processing system. The indicator layer is analyzed to determine the treatment characteristics of the indicator layer as a surrogate for the treatment characteristics of the plasma processing surface of the object under the same plasma processing conditions. The indicator layer is thereafter removed, if a removable indicator material was used.

The indicator layer serves two purposes in this approach. It receives the implanted, mixed, or deposited species (ions or electrons) and changes physical properties responsively. After the plasma processing of the indicator layer is complete, it is analyzed by relatively simple, quickly performed techniques to determine total treatment. These results can be made quantitative by calibration. After the total-treatment mapping of the surface is completed, the plasma processing system may be adjusted as necessary, such as, for example, by changing the plasma density, voltages, times, and/or gas pressures of the plasma used in the plasma processing.

The determination process can be repeated to assess the effects of the changes, and the system and processing again modified. This procedure can be repeated as many times as necessary until the desired spatial total treatment profile is achieved, replacing the indicator layer for each repetition. The processing is then conducted on the actual plasma processing surface of the object, with no indicator layer and with the confidence that plasma processing is substantially identical to that of the last iteration using the indicator layer.

The indicator layer also protects the surface of the object. All of the plasma processing is achieved in or on the indication layer, when present, and the surface of the object is not modified until the processing is conducted with no indicator layer present. Each time the previously removed indicator layer is removed and replaced with a new indicator layer for another repetition of the testing, the previously modified structure is removed and a fresh surface is presented.

The indicator layer is desirably a thin layer of an electrical nonconductor. Examples of acceptable indicator layer materials are a polyimide such as kapton or a polycarbonate such as lexan. The advantage of using these materials is that they change electrical properties, color, and/or optical transparency responsive to plasma processing. Measurement of these physical properties yields a measure of the plasma processing total treatment. The results are made quantitative by calibration to known values determined by other techniques.

Moreover, the effects of processing over the entire object surface can be assessed qualitatively. The qualitative inspection can be enormously valuable in identifying problem areas. When conventional coupon techniques are used, there is an incentive to use as few coupons as possible to minimize the time to analyze the coupons. As a result, problem areas of insufficient plasma processing may be missed because no coupon was placed at that area. This problem is particularly acute on large, irregularly shaped objects. With the present approach, a quick visual inspection over the entire surface covered by the indicator layer allows the identification of areas which have received too great or too little plasma processing, from the optical appearance of the indicator layer. Extra attention can be devoted to correcting these problems, once they are identified.

The present approach provides an important advance in the art of plasma processing objects, particularly large, irregularly shaped objects. Other features and advantages of the present invention will be apparent from the following more detailed description of the preferred embodiment, taken in conjunction with the accompanying drawings, which illustrate, by way of example, the principles of the invention.

BRIEF DESCRIPTION OF THE DRAWINGS

FIG. 5 is a graph of the correlation of measured surface resistance with nitrogen ion dose for a plasma ion implanted sheet of kapton; and FIG. 6 is a graph of the correlation of optical transmission of 600 nanometers wavelength radiation with nitrogen ion dose for a plasma ion implanted sheet of kapton.

DETAILED DESCRIPTION OF THE INVENTION

Figure 1:
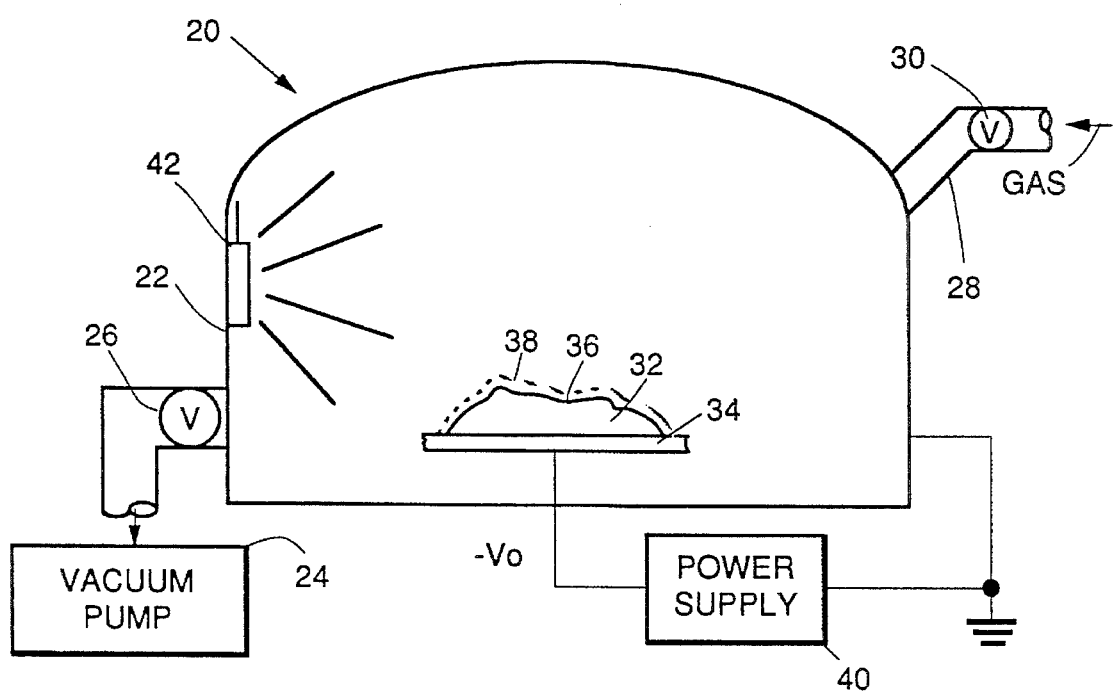
FIG. 1 is a schematic view of a plasma processing system with a plasma processing object therein.

The present invention is utilized in conjunction with the plasma processing of an object. A plasma processing apparatus 20, with which the invention may be used, is illustrated in FIG. 1 for the preferred case of a plasma ion implantation apparatus, but which may also be used for plasma ion deposition. The invention may also be practiced with other types of plasma processing, such as, for example, plasma ion mixing or electron bombardment.

The apparatus 20 includes a vacuum chamber 22 pumped by a vacuum pump 24 through a gate valve 26. The gas to be ionized and plasma ion implanted or deposited is backfilled to the interior of the chamber 22 through a gas line 28 having a valve 30. A three-dimensional, irregularly shaped object 32 to be plasma processed is supported in the vacuum chamber 22 on an electrically conducting support 34. (The use of the term "three-dimensional" indicates that the object 92 is not a flat surface, but instead has surface features to be treated that are not coplanar.) The support 34 is electrically isolated from the walls of the vacuum chamber 22. The object 32 can be of any type, either electrically conducting or electrically nonconducting, but in the application of most interest to the inventors the object is an electrically nonconducting polymeric material such as an epoxy. In one such application, the object 32 is a tool used in automobile component manufacturing and having dimensions of 3 feet by 5 feet by 1 foot thick, and an irregularly shaped surface.

The object 22 has a plasma processing surface 36, which may be all or part of its total surface. An indicator structure 38 may be placed over the plasma processing surface 36. The structure and use of the indicator structure 38 will be discussed in more detail subsequently.

The support 34 is electrically biased by the application of a voltage from a pulse modulator or power supply 40. A voltage source 42 forms a plasma using the gas admitted to the interior of the vacuum chamber 22 during plasma processing. The voltage source 42 is shown in a highly schematic form in FIG. 1, and is typically tailored to the nature of the object 32. In the case of the preferred nitrogen plasma ion processing, the support 34 is pulsed to a negative potential with respect to the plasma. The walls of the vacuum chamber 22 (as well as the plasma) are maintained at ground relative to the pulsed negative voltage.

To conduct plasma ion processing with this apparatus 20, the chamber 22 is first pumped out through the valve 26 to a vacuum of about $10^{-6}$ Torr. Nitrogen (or other gas to be ionized) is backfilled through the valve 30 to a steady state pressure of about $1-10\times10^{-5}$ Torr. The plasma ion processing voltage $-V_o$ is applied in a pulsed fashion by the power supply 40 or voltage modulator. Typical operating parameters are a repetition rate of the applied voltage pulses of 100–1000 cycles per second, with a pulse duration for the applied voltage of 10–30 microseconds. The nitrogen plasma is usually created using a discharge voltage of 100 volts and a discharge current of 1–10 amperes. For nitrogen plasma ion implantation, as an example, the negative applied potential is preferably −100,000 volts or more, but can be varied as necessary. Typical implantation times under these conditions are 4 hours to implant a dose of $1-10\times10^{17}$ per square centimeter. Typical deposition times under these conditions are 4 hours to implant a surface layer about 0.1 micrometers thick. Further details of plasma ion processing apparatus and procedures are described in U.S. Pat. No. 4,764,394, whose disclosure is incorporated by reference.

Figure 2:
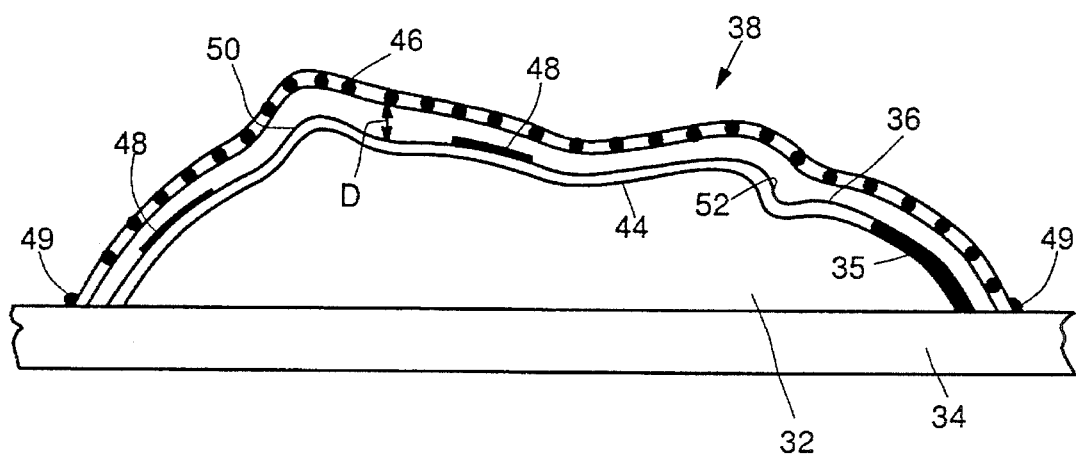
FIG. 2 is a detail of a portion of the plasma processing system of FIG. 1, illustrating the plasma processing object and adjacent structure in more detail.
Figure 3:
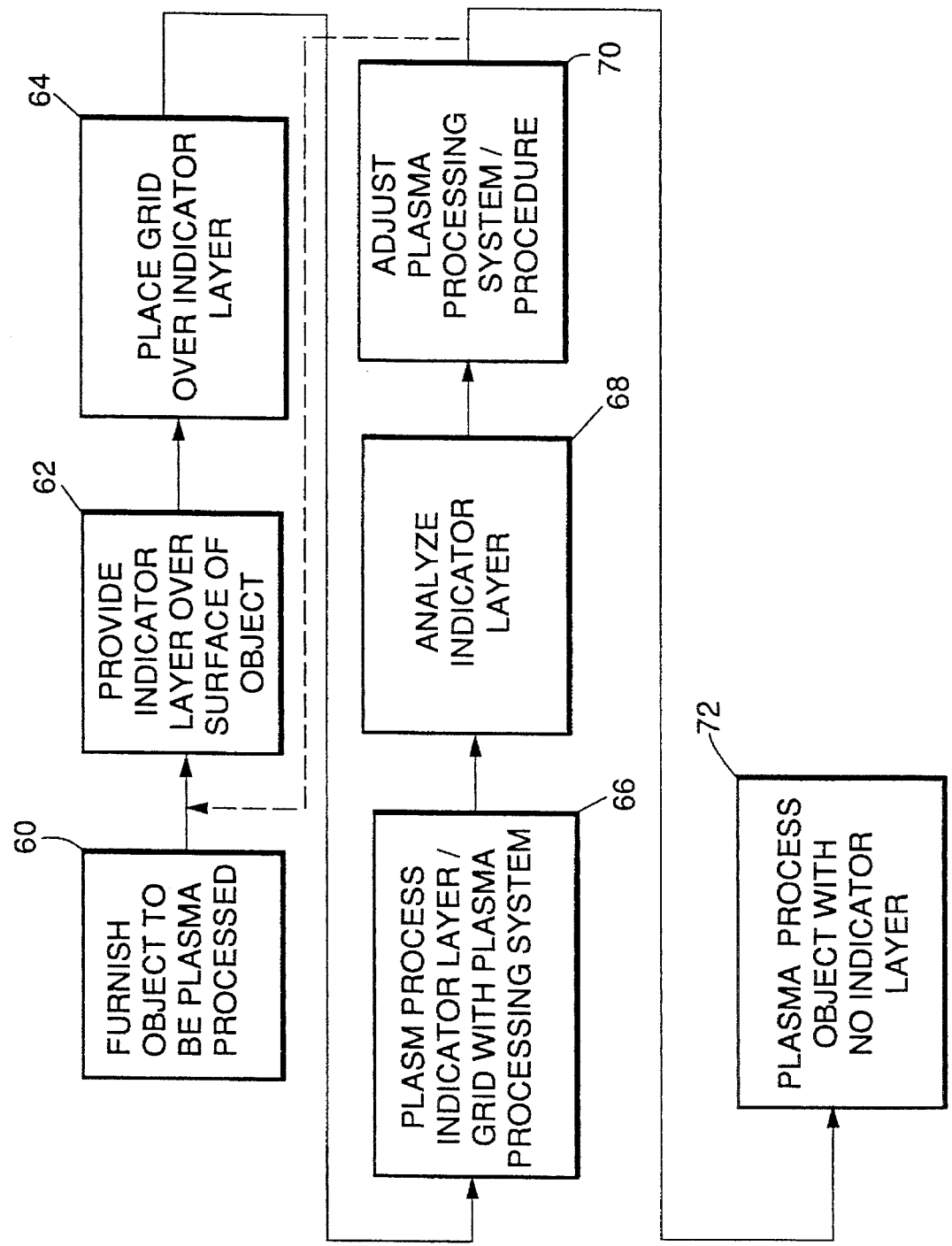
FIG. 3 is a flow diagram of a preferred implementation of the invention.

The preferred approach for practicing the method of the invention is illustrated in FIG. 3. The object 32 to be plasma processed is furnished, numeral 60. It is normally placed onto the support 34 for preparation, and the prepared object 32 and support 34 are later inserted into the vacuum chamber 22. The indicator structure 38 is placed over the surface 36 that is to be plasma processed. The indicator structure 38 is shown in greater detail in FIG. 2, which is not drawn to scale in order to more clearly illustrate the elements. A significant feature is that the indicator structure can be conformed to bumps or protrusions and also to depressions in the surface, as shown in FIG. 2.

An indicator layer 44 is provided over at least a portion of the plasma processing surface 36, numeral 62, the portion of the surface of the object 32 that is to be subsequently plasma processed. The indicator layer is made of an electrically nonconducting or weakly conducting material (herein collectively termed "nonconducting") that changes properties responsive to the plasma processing dosage of the indicator layer. A preferred material for the indicator layer is kapton, which is a polyimide polymeric material available from commercial distributors. Other materials such as the polycarbonate lexan may also be used.

The use of kapton is preferred, because both its optical and electrical properties change dramatically and in a regular manner responsive to the plasma processing total dosage. Its color and optical transmission both to white light and light of specific wavelengths changes with the plasma processing dosage. The electrical resistivity, which is initially sufficiently high that it is considered a nonconductor, decreases with increasing plasma processing dosage. The dosage state of a particular region of the indicator layer 44 is therefore a direct surrogate measure of the dosage that would have been introduced into the corresponding underlying region of the plasma processed surface 36 of the object 32, absent the indicator layer 44.

The indicator layer 44 is made relatively thin so that it can be conformed to the curvature and shape of the surface 36. The indicator layer 44 is preferably sufficiently thick to have the required structural integrity and strength, and also to retain substantially all of the charged particles therein. That is, the indicator layer 44 prevents charged particles from reaching the surface 36, when it is present. This feature permits the determination to be nondestructive in relation to the object 32 in the sense that no implantation or other modification occurs in the surface 36, regardless of how many times the procedure must be repeated until the plasma processing conditions are right. The indicator layer 44 is preferably about 0.0005–0.001 inches thick for most applications. Greater thicknesses provide no additional advantage. In fact, it is advantageous to perform the processing assessment as quickly as possible, and therefore a thin treated layer is desirable.

The indicator layer 44 may be provided In any operable manner. It may be supplied as a separate sheet of material and conformed to the surface 36. This convenient approach is preferred for surfaces, such as dies, which have some degree of irregularity but not to the extreme. Another approach is to deposit the material of the indicator layer from solution, by a vapor deposition process, or otherwise onto the surface of the object. This approach is less convenient for large surfaces, but has the advantage that it permits the material of the indicator layer to reach highly irregular areas, holes, and other features to which a separate sheet cannot be easily conformed. The indicator layer material must, however, be easily removable from the surface after the processing assessment is complete.

The indicator structure 38 further includes an electrically conductive grid 46 overlying the indicator layer 44. The grid 46 is placed over the indicator layer 44, numeral 64, but is spaced away from the indicator layer 44. The grid 46 is displaced from the surface of the indicator layer 44 by an amount D, which is at least about 0.5 inches. This displacement eliminates shadowing effects of the grid and nonuniform processing of the indicator layer beneath the grid wires. By this approach, a checkerboard pattern is avoided.

The grid 46 is made of an electrically conducting wire such as copper, stainless steel, or titanium. The wire is of small size, preferably about 0.010 inches in diameter. The grid 46 is woven from the wire in the manner of a window screen with an open mesh, preferably having at least 70 percent open space.

The grid 46 is made of an electrically conducting material, which is electrically connected, as by a weld 49, to the electrically conducting support 34. The grid 46 is therefore at a common potential with the support 34 and the object 32, biased to that potential by the power supply 40. In the preferred embodiment, the implanted or deposited ions are positively charged nitrogen ions. The grid is therefore biased negatively relatively to the processing chamber walls. The grid 46 (taken together with the support 34) completely surrounds and encloses the object to be processed. The grid material should be selected so that any sputtering of the grid that occurs as a result of the plasma processing and subsequently deposits onto the indicator layer, is minimal so as not to interfere with the intended modification of the layer.

The grid 46 is readily formed to generally follow the contours of the surface 36 of the object 32, but is displaced from it as discussed above. The terminology "generally following the contours of the surface" and related expressions, as used herein, are meant to convey the sense that the grid need not conform precisely to the surface of the object, with precisely the same outward displacement D from the surface at every location, for the invention to be operable. So, for example, the indicator structure 38 should generally follow the shape of protrusions 50 and depressions 52 in the surface of the object 32, but slight variations in the displacement D of the grid 46 from the surface 36 are acceptable. A virtue of the present approach is that it tolerates small variations in shape and spacing of the grid 46 as compared with the surface contours of the object 32. Further, slight separations of the indicator layer 44 from the contour of the surface 36, while not preferred, are acceptable.

A few calibration coupons 48 may be placed onto the surface of the indicator layer 44. The coupons are made of metal, such as stainless steel. The coupons are analyzed quantitatively and correlated with the adjacent regions of the indicator layer, in order to establish absolute total dose values in a manner to be discussed subsequently. The coupons are not a required part of the indicator structure 38, but are desirable to determine absolute dose values.

The entire surface 36 of the object 32 to be plasma processed may be covered by the grid 46. In a slight variation of the approach, only a portion of the surface of the object to be processed may be covered by the grid 46, and the remainder of the surface is covered by a solid electrically conducting mask 35, such as a piece of aluminum or stainless steel foil, as shown in a portion of FIG. 2. The mask 35 prevents plasma processing in the covered areas, but permits implantation, deposition, mixing, or electron bombardment to occur through the grid 46. In both embodiments, an electrically conducting shell is formed over the entire surface of the object that is to be treated. The object is thereby enclosed in a constant-potential volume defined by the grid, shell, and support table.

The object 32, lying on the support 34 and covered by the indicator structure 38, is placed into the apparatus 20. The apparatus 20 is operated to plasma process the indicator layer 44, numeral 66. (Plasma processing of the indicator layer at this stage is to be distinguished from plasma processing of the object itself at a later stage of the process. The indicator layer protects the surface of the object against any plasma processing at this stage.) The details of the plasma processing will be associated with each particular type of object and configuration of the apparatus 20. Some exemplary operating parameters were indicated previously. In a first iteration, the apparatus configuration and processing parameters thought appropriate to obtain the desired structure for the particular object are us ed and then refined in subsequent iterations as necessary.

Following the plasma processing of the indicator layer, the grid 46 is removed and the indicator layer is analyzed, numeral 68. The indicator layer may be analyzed in place or removed from the object, after suitable marking of reference locations. The analysis of the preferred indicator layer material is essentially of two types. A general visual analysis is conducted of the color and light transparency of the indicator layer. This visual analysis yields a general determination of the uniformity of the plasma processing.

For a more quantitative analysis, quantitative color, transparency, or electrical resistivity measurements are made of the indicator layer at locations of interest. These measurements as a group yield the relative quantitative relationship between the various locations on the indicator layer. The above discuss ion has focused on the analysis of the color, transparency, and electrical resistivity of the indicator layer. Other properties may also be analyzed, as appropriate for the preferred indicator layer material or other indicator layer materials.

The color, transparency, and/or electrical resistivity measurements can be made quantitative in an absolute sense by reference to standards in a calibration procedure. Reference standards are preferably prepared at the same time as the object is plasma processed. To do so, a few metal coupons used as reference standards are affixed to the surface of the indicator layer 44 at various locations. After plasma processing, the coupons are analyzed by the known SIMS technique to obtain an absolute quantitative value of the plasma processing dosage. These values are compared and correlated to quantitative color, transparency, or electrical measurements of the indicator layer taken immediately adjacent to the locations of the coupons. This procedure is to be contrasted to the conventional approach, where all data comes from coupon measurements. Here, only a few coupons are used as calibration standards for the measurements of the indicator layer.

Some results of such an analysis approach will be presented subsequently as Examples.

If the measurements of the indicator layer show that the plasma processing system and process have not produced satisfactory results, the plasma processing system and/or process can be adjusted as necessary, numeral 70. If no adjustments are made, or if the adjustments are so minor that the operator concludes that the desired result will be produced in the object 32, the object 32 is thereafter plasma processed with no indicator structure 38 present, numeral 72.

On the other hand, if the adjustments are such that the operator concludes that further nondestructive assessment is required, the steps 64, 66, 68, and 70 can be repeated as many times as necessary. During the repetitions, a fresh indicator layer may be used, or in other cases the same indicator layer may be used. Generally, if the only shortcoming is that the plasma processing has not produced a sufficiently high dosage, the same indicator layer can be reused until the required total dosage has been reached. If, on the other hand, there are spatial variations in the dosage such that some regions receive too high a dosage, replacement of the indicator layer may be required. During the initial assessment and the repetitions of the plasma processing of the indicator layer(s), the indicator layer protects the surface 36 of the object against plasma processing. When the system finally is adjusted to produce the desired result, the protective indicator layer is omitted and the surface 36 of the object 32 is plasma processed.

The following examples are presented to illustrate aspects of the invention, and should not be taken as limiting of the invention in any respect.

EXAMPLE 1

The approach of the invention has been demonstrated for the plasma ion implantation (PII) processing, with nitrogen ions, of a large-scale certified automotive die. The die was about 3 feet×5 feet×1 foot in size, was made of iron-filled epoxy, and weighed about 7,000 pounds. The preferred approach as described above was used to determine the configuration of the plasma processing system and the plasma processing parameters. Both qualitative and quantitative assessments of the kapton indicator sheet were made. Three iterations of the indicator layer processing and system adjustment steps of FIG. 3 were performed, before the die object itself was plasma processed. For each iteration of plasma processing of the indicator layer, the total plasma processing time of the indicator layer was about five minutes, demonstrating a rapid optimization assessment using the approach of the invention.

EXAMPLE 2

Figure 4:
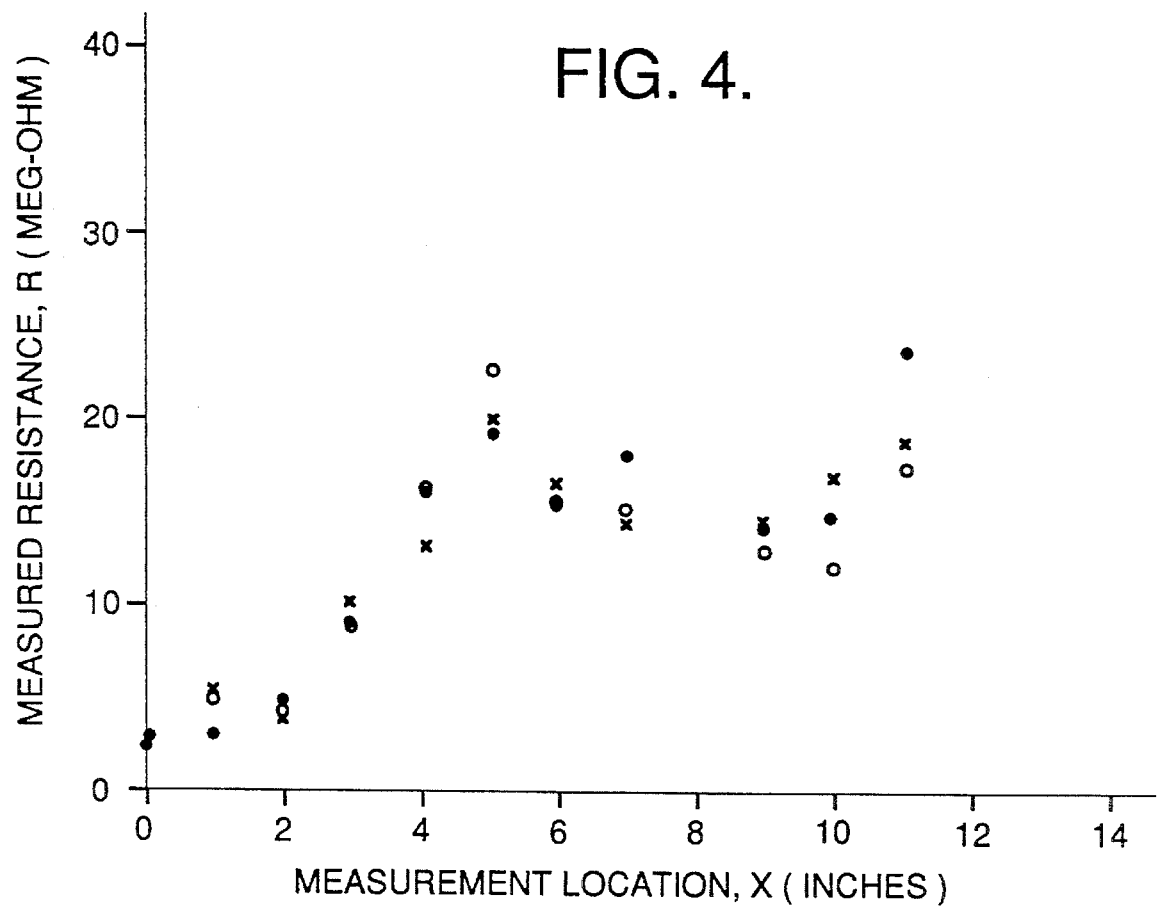
FIG. 4 is graph of the variation of surface resistance with location for a plasma ion implanted sheet of kapton.

The approach of the invention has been demonstrated for the plasma processing of a practice die object having a size of about 12 inches by 23 inches in lateral extent, made of epoxy. Both qualitative and quantitative assessments of the indicator sheet were made. FIG. 4 presents the results of three sets of electrical resistivity measurements across the indicator layer along the same track parallel to the 12-inch dimension, made using a 2-point resistivity probe in the form of a hand-held multimeter. The results of the three sets of measurements are in general agreement with each other, with some minor variation. The results show a wide variation in resistivity along the track of the measurement, reflecting a wide variation in total dosage that was intentionally produced in order to verify the technique. The entire set of measurements was completed in less than 15 minutes.

EXAMPLE 3

Absolute correlations of the data of FIG. 4 were made. During the plasma processing described in Example 2, some metal coupons were mounted on the surface of the indicator layer. After plasma processing was complete, the metal coupons were analyzed for total dose or fluence by SIMS. FIG. 5 shows the resulting calibration curve of electrical resistivity against total dose. This data of FIG. 5 is cross correlated to determine the total ion implantation dose as a function of location for the resistivity measurements of FIG. 4. These results establish that electrical resistivity of the indicator layer is an absolute quantitative surrogate for the total dosage of the indicator layer.

EXAMPLE 4

Optical properties were correlated in an absolute quantitative sense using the approach discussed previously. FIG. 6 is a graph of the optical transmittance at 600 nanometers wavelength of some test specimens of the preferred indicator layer material that were plasma processed to varying total dose levels together with some test coupons. The optical transmittance was measured and correlated with the total ion implantation dose measured from the test coupons. As in the case of electrical resistivity, the light transmittance can be used as an absolute quantitative measure of the dose received by the indicator layer at any selected location.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for plasma processing an object in a plasma processing system, comprising the steps of:

furnishing an object having a plasma processing surface that is to be treated by plasma processing;

providing over at least a portion of the plasma processing surface, so as to generally conform to the shape of the plasma processing surface, an indicator layer of an electrically nonconducting material that changes properties responsively to the plasma processing treatment;

placing over the indicator layer an electrically conductive grid, so that the electrically conductive grid is spaced apart from the indicator layers, but generally conforms to the shape of the indicator layer;

plasma processing the indicator layer through the conductive grid, using the plasma processing system; and analyzing the indicator layer to determine the an analyzed property of the indicator layer as a surrogate for a property of interest of the plasma processing surface of the object under the same plasma processing conditions.

2. The method of claim 1, wherein the indicator layer is from about 0.0005 inches to about 0.001 inches thick.

3. The method of claim 1, where the electrically conductive grid is a metal grid, further including the step of establishing the metal grid as completely surrounding the object and at the same electrical potential as the object, the step of establishing to occur prior to the step of plasma processing.

4. The method of claim 1, further including the step of establishing the grid and the object at the same electrical potential, the step of establishing to occur prior to the step of plasma processing.

5. The method of claim 1, further including the step, after the step of analyzing, of plasma processing the plasma processing surface of the object.

6. The method of claim 1, further including the step of adjusting the plasma processing system, the step of adjusting to occur after the step of analyzing and responsive thereto.

7. The method of claim 6, further including the step of plasma processing the plasma processing surface of the object, the step of plasma processing the plasma processing surface to occur after the step of adjusting.

8. The method of claim 1, wherein the step of providing said indicator layer includes the step of furnishing said indicator layer of a material selected from the group consisting of a polyimide and a polycarbonate, so as to generally conform to the shape of the plasma processing surface.

9. The method of claim 1, wherein the step of analyzing includes the step of measuring an electrical resistivity of the indicator layer.

10. The method of claim 1, wherein the step of analyzing includes the step of measuring an optical property of the indicator layer.

11. The method of claim 1, further including the additional step, prior to the step of plasma processing, of placing at least one metallic plasma processing calibration coupon in at least one location on the indicator layer, and further including the additional step, after the step of plasma processing, of analyzing the plasma processing calibration coupon.

12. The method of claim 11, including the additional step, after the steps of analyzing the indicator layer and analyzing the plasma processing calibration coupon, of correlating the analysis results of the indicator layer and the plasma processing calibration coupon.

13. The method of claim 1, including the additional step, after the step of analyzing the indicator layer, of correlating the results of the step of analyzing the indicator layer with a preexisting correlation relation of the analyzed property with the property of interest.

14. The method of claim i, wherein the step of providing an indicator layer includes the step of providing a sheet of the indicator layer material; and conforming the sheet to the surface of the object.

15. The method of claim 1, wherein the step of providing an indicator layer includes the step of depositing a layer of the indicator layer material onto the surface of the object.

16. The method of claim 1, wherein the step of plasma processing includes the step of ion implanting the indicator layer.

17. The method of claim 1, wherein the step of plasma processing includes the step of ion depositing the indicator layer.

18. The method of claim 1, wherein the step of plasma processing includes the step of ion mixing the indicator layer.

19. The method of claim 1, wherein the step of plasma processing includes the step of electron bombarding the indicator layer.

20. The method of claim 1, wherein the step of placing includes the step of displacing the electrically conductive grid a distance of at least about 0.5 inches from the indicator layer.

21. A method for plasma processing an object in a plasma processing system, comprising the steps of:

furnishing a three-dimensional, irregularly shaped object having a plasma processing surface that is to be treated by plasma processing in a plasma processing system that forms a plasma when in operation;

providing over at least a portion of the surface of the object, so as to generally conform to the shape of the plasma processing surface, an indicator layer of a material selected from the group consisting of a polyimide and a polycarbonate, so as to generally conform to the shape of the plasma processing surface;

placing over the indicator layer an electrically conductive grid, so that the electrically conductive grid is spaced apart from but lies between the indicator layer and the plasma formed when the plasma processing system is in operation;

establishing the grid and the object at a common electrical potential;

plasma processing the indicator layer through the conductive grid, after the step of establishing, using the plasma processing system; and analyzing the indicator layer to determine the an analyzed property of the indicator layer as a surrogate for a property of interest of the plasma processing surface of the object under the same plasma processing conditions.

* * * * *